(12) United States Patent
Wallace et al.

(10) Patent No.: US 10,037,164 B1
(45) Date of Patent: Jul. 31, 2018

(54) FLASH INTERFACE FOR PROCESSING DATASETS

(71) Applicant: EMC Corporation, Hopkinton, MA (US)

(72) Inventors: Grant R. Wallace, Pennington, NJ (US); Philip N. Shilane, Newton, PA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 15/196,110

(22) Filed: Jun. 29, 2016

(51) Int. Cl.
| | |
|---|---|
| *G06F 12/00* | (2006.01) |
| *G06F 13/00* | (2006.01) |
| *G06F 13/28* | (2006.01) |
| *G06F 3/06* | (2006.01) |
| *G11C 16/10* | (2006.01) |
| *G11C 16/16* | (2006.01) |
| *G06F 12/0802* | (2016.01) |

(52) U.S. Cl.
CPC ............ *G06F 3/064* (2013.01); *G06F 3/061* (2013.01); *G06F 3/0616* (2013.01); *G06F 3/0679* (2013.01); *G06F 12/0802* (2013.01); *G11C 16/10* (2013.01); *G11C 16/16* (2013.01); *G06F 2212/222* (2013.01)

(58) Field of Classification Search
CPC ............ G06F 3/00; G06F 3/06–3/061; G06F 3/0611–3/0616; G06F 3/0617–3/0638; G06F 3/064–3/0677; G06F 3/0679–3/0689; G06F 12/00–12/0246; G06F 12/0802; G06F 2003/0691–2003/0698; G06F 2212/00–2212/7211; G11C 7/00–7/24; G11C 16/00–16/0491; G11C 16/06–16/10; G11C 16/102–16/16; G11C 16/18–16/3495; G11C 2207/00–2207/229; G11C 2216/00–2216/30
See application file for complete search history.

(56) References Cited

U.S. PATENT DOCUMENTS

| | | | |
|---|---|---|---|
| 4,513,367 A | 4/1985 | Chan | |
| 4,785,395 A | 11/1988 | Keeley | |
| 5,333,318 A | 7/1994 | Wolf | |
| 5,590,320 A | 12/1996 | Maxey | |
| 5,630,093 A * | 5/1997 | Holzhammer | ........ G06F 3/0601 711/115 |
| 5,644,701 A | 7/1997 | Takewaki | |
| 5,682,497 A | 10/1997 | Robinson | |

(Continued)

OTHER PUBLICATIONS

CAFTL: A Content-Aware Flash Translation Layer Enhancing the Lifespan of Flash Memory based Solid State Drives; Chen et al; Proceedings of the 9th USENIX conference on File and stroage technologies; Feb. 15-17, 2011; retrieved from Proceedings of the 9th USENIX conference on File and stroage technologies on Jul. 15, 2017 (14 pages).*

(Continued)

*Primary Examiner* — Daniel C Chappell
(74) *Attorney, Agent, or Firm* — Workman Nydegger

(57) ABSTRACT

Systems and methods for managing content in a flash memory. Content or data in a flash memory is overwritten when the write operation only requires bits to be set. This improves performance of the flash and extends the life of the flash memory.

20 Claims, 4 Drawing Sheets

(56) References Cited

U.S. PATENT DOCUMENTS

| | | | |
|---|---|---|---|
| 5,684,976 A | 11/1997 | Soheili-Arasi | |
| 5,740,349 A * | 4/1998 | Hasbun | G11C 29/765 |
| | | | 714/6.13 |
| 5,761,501 A | 6/1998 | Lubbers | |
| 5,838,614 A * | 11/1998 | Estakhri | G06F 3/061 |
| | | | 365/185.11 |
| 5,907,856 A * | 5/1999 | Estakhri | G06F 3/061 |
| | | | 711/103 |
| 5,909,694 A | 6/1999 | Gregor | |
| 5,913,226 A | 6/1999 | Sato | |
| 5,966,726 A | 10/1999 | Sokolov | |
| 6,046,936 A * | 4/2000 | Tsujikawa | G11C 11/5621 |
| | | | 365/185.03 |
| 6,049,672 A | 4/2000 | Shiell | |
| 6,119,209 A | 9/2000 | Bauman | |
| 6,128,623 A | 10/2000 | Mattis | |
| 6,192,450 B1 | 2/2001 | Bauman | |
| 6,216,199 B1 | 4/2001 | DeKoning | |
| 6,272,593 B1 | 8/2001 | Dujari | |
| 6,360,293 B1 * | 3/2002 | Unno | G11C 29/765 |
| | | | 711/103 |
| 6,510,083 B1 * | 1/2003 | See | G11C 16/102 |
| | | | 365/185.03 |
| 6,594,723 B1 * | 7/2003 | Chapman | G06F 8/65 |
| | | | 711/103 |
| 6,636,950 B1 | 10/2003 | Mithal | |
| 6,807,615 B1 | 10/2004 | Wong | |
| 6,851,015 B2 | 2/2005 | Akahane | G11C 16/105 |
| | | | 365/228 |
| 6,901,499 B2 * | 5/2005 | Aasheim | G06F 12/0246 |
| | | | 711/103 |
| 6,965,970 B2 | 11/2005 | Mosur | |
| 6,978,342 B1 * | 12/2005 | Estakhri | G06F 3/0613 |
| | | | 711/103 |
| 7,290,109 B2 * | 10/2007 | Horii | G06F 13/1647 |
| | | | 711/103 |
| 7,433,245 B2 * | 10/2008 | Otsuka | G06F 3/0622 |
| | | | 365/189.011 |
| 7,472,205 B2 | 12/2008 | Abe | |
| 7,533,214 B2 * | 5/2009 | Aasheim | G06F 3/0619 |
| | | | 711/103 |
| 7,640,262 B1 | 12/2009 | Beaverson | |
| 7,673,099 B1 | 3/2010 | Beaverson | |
| 7,702,628 B1 | 4/2010 | Luchangco | |
| 7,711,923 B2 | 5/2010 | Rogers | |
| 7,720,892 B1 | 5/2010 | Healey, Jr. | |
| 7,930,559 B1 | 4/2011 | Beaverson | |
| 8,300,465 B2 * | 10/2012 | Jeon | G11C 16/26 |
| | | | 365/145 |
| 8,533,395 B2 | 9/2013 | O'Connor | |
| 8,583,854 B2 * | 11/2013 | Ji | G06F 3/0613 |
| | | | 710/39 |
| 8,606,604 B1 | 12/2013 | Huber | |
| 8,634,248 B1 | 1/2014 | Sprouse | |
| 8,738,841 B2 | 5/2014 | Olbrich | |
| 8,793,543 B2 | 7/2014 | Tai | |
| 8,811,074 B2 | 8/2014 | Goss | |
| 8,817,541 B2 | 8/2014 | Li | |
| 8,904,117 B1 | 12/2014 | Kalekar | |
| 8,910,020 B2 | 12/2014 | Frayer | |
| 8,917,559 B2 * | 12/2014 | Bisen | G11C 11/5628 |
| | | | 365/185.11 |
| 8,935,446 B1 | 1/2015 | Shilane | |
| 8,943,282 B1 | 1/2015 | Armangau | |
| 9,026,737 B1 | 5/2015 | Armangau | |
| 9,043,517 B1 | 5/2015 | Sprouse | |
| 9,098,420 B2 | 8/2015 | Bulut | |
| 9,135,123 B1 | 9/2015 | Armangau | |
| 9,152,496 B2 * | 10/2015 | Kanade | G06F 11/1068 |
| 9,171,629 B1 * | 10/2015 | Kokubun | G11C 16/10 |
| 9,189,414 B1 | 11/2015 | Shim | |
| 9,213,642 B2 | 12/2015 | Chiu | |
| 9,274,954 B1 | 3/2016 | Bairavasundaram | |
| 9,281,063 B2 * | 3/2016 | Xiang | G11C 16/04 |
| 9,313,271 B2 | 4/2016 | Venkat | |
| 9,317,218 B1 | 4/2016 | Botelho | |
| 9,436,403 B1 | 9/2016 | Zhang | |
| 9,442,662 B2 | 9/2016 | Dancho | |
| 9,442,670 B2 | 9/2016 | Kruger | |
| 9,524,235 B1 | 12/2016 | Sprouse | |
| 9,697,267 B2 | 7/2017 | Kadayam | |
| 9,703,816 B2 | 7/2017 | George | |
| 9,870,830 B1 | 1/2018 | Jeon | |
| 2001/0029564 A1 * | 10/2001 | Estakhri | G06F 3/061 |
| | | | 711/103 |
| 2003/0009623 A1 | 1/2003 | Arimilli | |
| 2003/0009637 A1 | 1/2003 | Arimilli | |
| 2003/0009639 A1 | 1/2003 | Arimilli | |
| 2003/0009641 A1 | 1/2003 | Arimilli | |
| 2003/0009643 A1 | 1/2003 | Arimilli | |
| 2003/0217227 A1 | 11/2003 | Parthasarathy | |
| 2004/0123270 A1 | 6/2004 | Zhuang | |
| 2005/0120180 A1 | 6/2005 | Schornbach | |
| 2005/0165828 A1 | 7/2005 | Lango | |
| 2006/0015768 A1 | 1/2006 | Valine | |
| 2006/0059171 A1 | 3/2006 | Borthakur | |
| 2006/0101200 A1 | 5/2006 | Doi | |
| 2006/0143390 A1 | 6/2006 | Kottapalli | |
| 2006/0179174 A1 | 8/2006 | Bockhaus | |
| 2006/0184744 A1 | 8/2006 | Langston | |
| 2007/0005928 A1 | 1/2007 | Trika | |
| 2007/0061504 A1 * | 3/2007 | Lee | G11C 16/349 |
| | | | 711/103 |
| 2007/0156842 A1 | 7/2007 | Vermeulen | |
| 2007/0180328 A1 | 8/2007 | Cornwell | |
| 2007/0300037 A1 | 12/2007 | Rogers | |
| 2008/0046655 A1 | 2/2008 | Bhanoo | |
| 2008/0065809 A1 | 3/2008 | Eichenberger | |
| 2008/0077782 A1 | 3/2008 | Lataille | |
| 2008/0120469 A1 | 5/2008 | Kornegay | |
| 2008/0147714 A1 | 6/2008 | Breternitz | |
| 2008/0177700 A1 | 7/2008 | Li | |
| 2008/0183955 A1 | 7/2008 | Yang | |
| 2008/0263114 A1 | 10/2008 | Nath | |
| 2008/0266962 A1 * | 10/2008 | Jeon | G11C 16/349 |
| | | | 365/185.12 |
| 2008/0273400 A1 * | 11/2008 | La Rosa | G11C 16/102 |
| | | | 365/185.29 |
| 2008/0313132 A1 | 12/2008 | Hao | |
| 2009/0063508 A1 | 3/2009 | Yamato | |
| 2009/0216788 A1 | 8/2009 | Rao | |
| 2009/0222626 A1 | 9/2009 | Ingle | |
| 2009/0240871 A1 | 9/2009 | Yano | |
| 2009/0300265 A1 * | 12/2009 | Vyssotski | G11C 16/349 |
| | | | 711/100 |
| 2010/0023697 A1 | 1/2010 | Kapoor | |
| 2010/0070715 A1 | 3/2010 | Waltermann | |
| 2010/0082805 A1 | 4/2010 | Kwon | |
| 2010/0115182 A1 | 5/2010 | Murugesan | |
| 2010/0165715 A1 * | 7/2010 | Donze | G11C 8/10 |
| | | | 365/163 |
| 2010/0185807 A1 | 7/2010 | Meng | |
| 2010/0199027 A1 | 8/2010 | Pucheral | |
| 2010/0211744 A1 | 8/2010 | Morrow | |
| 2010/0229005 A1 * | 9/2010 | Herman | G06F 12/1408 |
| | | | 713/193 |
| 2010/0306448 A1 | 12/2010 | Chen | |
| 2010/0332952 A1 | 12/2010 | Chung | |
| 2011/0010698 A1 * | 1/2011 | Byom | G11C 29/08 |
| | | | 717/168 |
| 2011/0022778 A1 * | 1/2011 | Schibilla | G06F 12/0246 |
| | | | 711/103 |
| 2011/0072217 A1 | 3/2011 | Hoang | |
| 2011/0138105 A1 * | 6/2011 | Franceschini | G06F 12/0246 |
| | | | 711/103 |
| 2011/0138132 A1 | 6/2011 | Brueggen | |
| 2011/0153953 A1 | 6/2011 | Khemani | |
| 2011/0225141 A1 | 9/2011 | Chaudhry | |
| 2011/0264865 A1 | 10/2011 | Mobarak | |
| 2011/0276780 A1 | 11/2011 | Sengupta | |
| 2011/0276781 A1 | 11/2011 | Sengupta | |

(56) References Cited

U.S. PATENT DOCUMENTS

| | | | |
|---|---|---|---|
| 2011/0296110 A1 | 12/2011 | Lilly | |
| 2012/0054414 A1 | 3/2012 | Tsai | |
| 2012/0084484 A1* | 4/2012 | Post | G06F 3/061 710/308 |
| 2012/0102268 A1 | 4/2012 | Smith | |
| 2012/0110247 A1 | 5/2012 | Eleftheriou | |
| 2012/0215970 A1 | 8/2012 | Shats | |
| 2012/0275466 A1 | 11/2012 | Bhadra | |
| 2013/0036418 A1 | 2/2013 | Yadappanavar | |
| 2013/0103911 A1 | 4/2013 | Bulut | |
| 2013/0205089 A1 | 8/2013 | Soerensen | |
| 2013/0282964 A1 | 10/2013 | Sengupta | |
| 2013/0325817 A1 | 12/2013 | Whitehouse | |
| 2013/0339576 A1 | 12/2013 | Liu | |
| 2014/0013027 A1 | 1/2014 | Jannyavula Venkata | |
| 2014/0098619 A1* | 4/2014 | Nazarian | G11C 13/0007 365/189.011 |
| 2014/0122818 A1 | 5/2014 | Hayasaka | |
| 2014/0136762 A1 | 5/2014 | Li | |
| 2014/0143505 A1 | 5/2014 | Sim | |
| 2014/0149401 A1 | 5/2014 | Liu | |
| 2014/0173330 A1 | 6/2014 | Samanta | |
| 2014/0215129 A1 | 7/2014 | Kuzmin | |
| 2014/0281167 A1 | 9/2014 | Danilak | |
| 2014/0281824 A1* | 9/2014 | Oh | G11C 11/1675 714/773 |
| 2015/0127889 A1 | 5/2015 | Hwang | |
| 2015/0205722 A1 | 7/2015 | Chiu | |
| 2015/0277786 A1* | 10/2015 | Rostock | G06F 3/061 711/103 |
| 2015/0331807 A1 | 11/2015 | Lie | |
| 2015/0347291 A1 | 12/2015 | Choi | |
| 2015/0363285 A1 | 12/2015 | Delaney | |
| 2016/0041927 A1 | 2/2016 | Jung | |
| 2016/0147669 A1 | 5/2016 | Huang | |
| 2016/0274819 A1 | 9/2016 | Choi | |
| 2017/0060439 A1 | 3/2017 | Harawasa | |
| 2017/0091054 A1 | 3/2017 | Delaney | |

OTHER PUBLICATIONS

NAND Flash Memory: Challenges and Opportunities; Li et al; IEEE Computer, vol. 46, iss. 8; Aug. 2013; pp. 23-29 (Year: 2013).*

Dysource: a high performance and scalable NAND flash controller architecture based on source synchronous interface; Wu et al; Proceedings of the 12th ACM International Conference on Computing Frontiers, Article No. 25; May 18-21, 2015 (Year: 2015).*

Hardware/software architecture for flash memory storage systems; Min et al; Proceedings of the 14th international conference on Compilers, architectures and synthesis for embedded systems; Oct. 9-14, 2011; pp. 235-236 (Year: 2011).*

A self-adjusting flash translation layer for resource-limited embedded systems; Wu, Chin-Hsien; ACM Transactions on Embedded Computing Systems, vol. 9, iss. 4, Article No. 31; Mar. 2010 (Year: 2010).*

U.S. Appl. No. 15/196,150, filed Jun. 29, 2016, Shilane, et al.
U.S. Appl. No. 15/196,163, filed Jun. 29, 2016, Wallace, et al.
U.S. Appl. No. 15/196,196, filed Jun. 29, 2016, Wallace, et al.
U.S. Appl. No. 15/196,261, filed Jun. 29, 2016, Shilane, et al.
U.S. Appl. No. 15/196,283, filed Jun. 29, 2016, Shilane, et al.

A Forest-structured Bloom Filter with flash memory; Lu et al; IEEE 27th Symposium on Mass Storage Systems and Technologies; May 23-27, 2011 (6 pages).

Algorithms in Java, Third Edition; Sedgewick, Robert; ISBN 0-201-36120-5; 2003; pp. 91-94 (4 pages).

Skip lists: a probabilistic alternative to balanced trees; Pugh, William; Communications of the ACM, vol. 33, iss. 6; Jun. 19990; pp. 668-676 (9 pages).

DHash: A cache-friendly TCP lookup algorithm for fast network processing; Zhang et al; 38th Conference on Local Computer Networks; Oct. 21-24, 2013; pp. 484-491 (8 pages) (Year: 2013).

A comparison of adaptive radix trees and hash tables; Alvarez et al; 31st International Conference on Data Engineering; Apr. 13-17, 2015; pp. 1227-1238 (12 pages) (Year: 2015).

A Workload-Aware Adaptive Hybrid Flash Translation Layer with an Efficient Caching Strategy; Park et al; 19th International Symposium on Modeling, Analysis & Simulation of Computer and Telecommunication Systems; Jul. 25-27, 2011; pp. 248-255 (8 pages) (Year: 2011).

B-tree indexes and CPU caches; Graefe et al; 17th International Conference on Data Engineering; Apr. 2-6, 2001; pp. 349-358 (10 pages) (Year: 2001).

History-aware page replacement algorithim for NAND flash-based consumer electronics; Lin etal.; IEEE Transactions on Consumer Electronics, vol. 62, iss. 1; Feb. 2016; pp. 23-29 (Year: 2016).

A novel hot data identification mechanism for NAND flash memory; Liu et al.; IEEE Transactions on Consumer Electronics, vol. 61, iss. 4; Nov. 2015; pp. 463-469 (Year: 2015).

Hot data identification for flash-based storage systems using multiple bloom filters; Park et al.; 27th Symposium on Mass Storage Systems and Technologies; May 23-27, 2011 (Year: 2011).

BloomFlash: Bloom Filter on Flash-Based Storage; Debnath et al.; 2011 31st International Conference on Distributed Computing Systems; Jun. 20-24, 2011; pp. 635-644 (Year: 2011).

* cited by examiner

FLASH INTERFACE FOR PROCESSING DATASETS

FIELD OF THE INVENTION

Embodiments of the invention relate to systems and methods for processing large datasets. More particularly, embodiments of the invention relate to systems and methods for interfacing and interacting with a memory device such as a flash memory device.

BACKGROUND

As the amount of data in computing systems continues to increase, there is a strong desire for improvements that allows the datasets to be efficiently processed. DRAM (Dynamic Random Access Memory) and the like are often too small to efficiently process large data sets. Algorithms that process the data out-of-core (using Hard Disk Drives (HDDs) tend to be slow.

One potential solution is to introduce flash memory into the computing systems. Flash memory is faster than HDDs and has the capacity to accelerate dataset analysis. Even though flash memory can improve the processing capability of computing systems, flash memory has several problems that impact performance.

For example, conventional data structures are designed assuming that random changes or random edits can be performed quickly and without penalty. Flash, memory, however, has a penalty associated with small edits. Small edits in a flash memory require the edited page to be copied forward to a new page. The previous page must be eventually erased before it can be reused. More specifically, data in a used area or page of a flash memory cannot be simply overwritten in a conventional flash memory. Rather, it is necessary to erase the page before writing the data. This is the reason that small edits to a page in the flash memory are simply written as a new page.

This process causes both a performance penalty and a lifespan penalty. This process results in multiple reads and writes (thus the performance penalty). The lifespan penalty occurs because flash memory can only be written or erased a limited number of times before wearing out. Further, flash memory is typically erased in large units. Systems and methods are needed to improve the performance of flash memory and to improve the lifespan of the flash memory.

BRIEF DESCRIPTION OF THE DRAWINGS

In order to describe the manner in which at least some aspects of this disclosure can be obtained, a more particular description will be rendered by reference to specific embodiments thereof which are illustrated in the appended drawings. Understanding that these drawings depict only example embodiments of the invention and are not therefore to be considered to be limiting of its scope, embodiments of the invention will be described and explained with additional specificity and detail through the use of the accompanying drawings, in which.

DETAILED DESCRIPTION OF SOME EXAMPLE EMBODIMENTS

Figure 1:
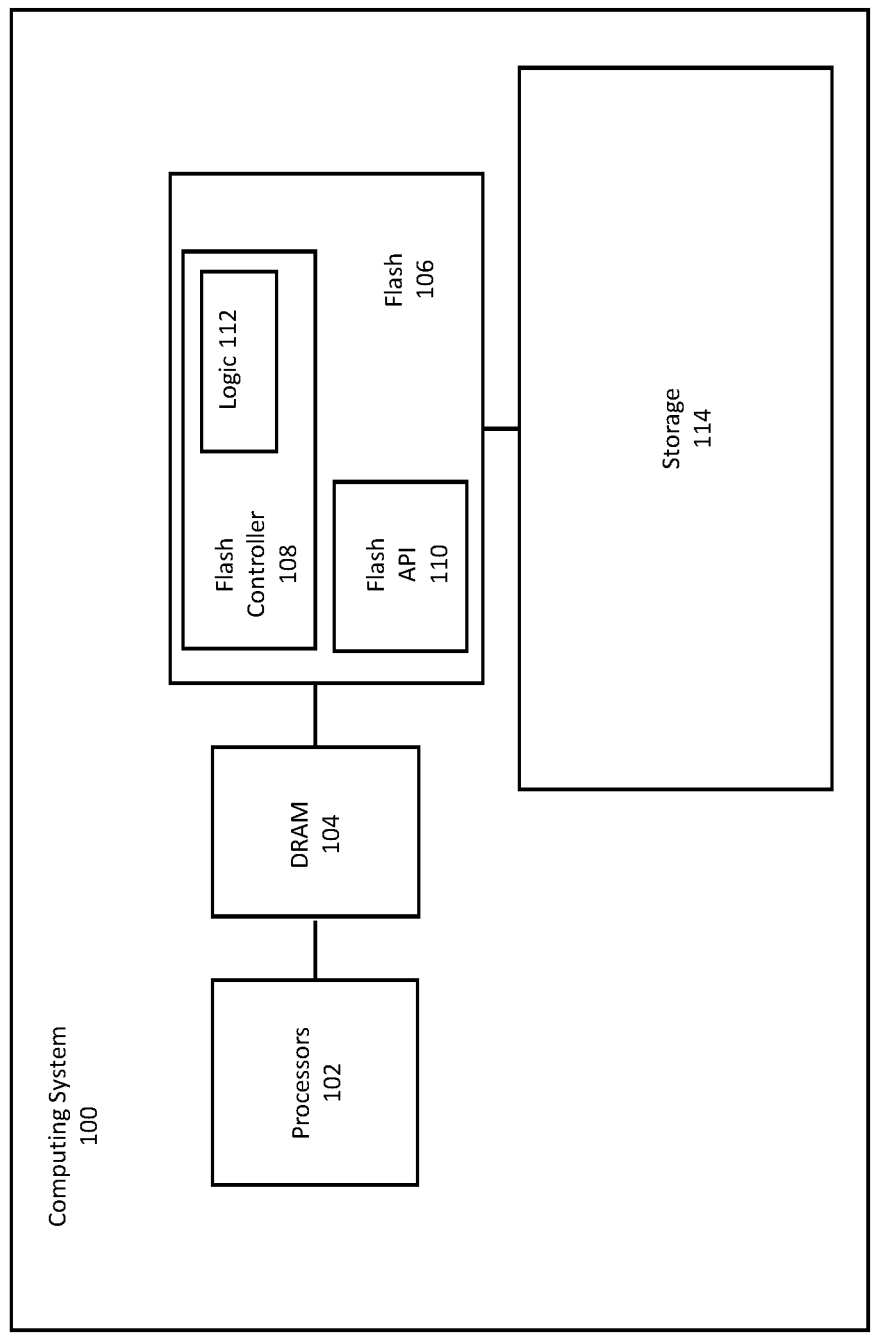
FIG. 1 illustrates an example of a computing system that is configured to perform overwrites in a flash memory.

Embodiments of the invention relate to systems and methods for processing large datasets. Embodiments of the invention further relate to systems and methods for processing large datasets in a flash memory (e.g., SSD (solid state drive)). Embodiments of the invention further relate to systems and methods for controlling or managing flash memory and to interfacing with flash memory.

In a conventional flash memory, the ability to set a bit (i.e., change from a logical 0 to a logical 1) may be supported. However, changing a bit from a logical 1 to a logical 0 (unset the bit) is not supported at this level (e.g., the bit level). Rather, it is necessary to erase a larger unit in the flash memory. By way of example, flash memory may be erased in 1 megabyte units. As a result, it is not generally possible to overwrite existing data in flash. Instead, the data is written to a new location (which may have been previously erased) and the old location is marked for erasure. Embodiments of the invention enable overwrites of existing data in some instances and in various data structures. Embodiments of the invention allow data structures to be implemented in flash while reducing the number of associated erasures by overwriting some of the data.

A flash memory may include a controller and an interface (e.g., API (application programming interface)) associated with the flash memory controller. In one example, the logic of the flash memory controller is configured to perform writes to existing data (overwriting the existing data) rather than write the data to a new location and mark the old location for deletion. If necessary, the controller may cause the data to be simply written to a new location. For an overwrite operation, the controller may initially read the previous version of the page or block being written. If the changes being written only result in the setting of more logical 1s (or changing 0s to 1s), then the existing page or block can be overwritten. If some bits need to be unset (changed from 1s to 0s) in the flash memory, then the write may be performed normally to a new page. During this process (read-check-overwrite), the page or block may be locked.

In another example, an overwrite can be achieved using calls to a flash memory API. Calls include, by way of example, a logical-OR and a Compare-and-Swap.

During a logical-OR call, a client may provide a block of data and an address. The page (or pages depending on the size of the block of data) at that address is modified to the logical OR of its current contents with the provided block. This only requires setting additional bits. As a result, an overwrite may be performed on the current page or pages without the need to write to a new page or pages. The logical OR changes 0s in the target block that correspond to 1s in the new data to be set. It may not be necessary to perform an OR operation for each bit in the overwrite operation. It may only be necessary to identify the 0s that need to be changed to 1s.

An overwrite may occur in flash memory by performing a logical OR operation. This operation ensures that 1s located in a target block are unaffected while 0s are potentially changed to 1s. The change occurs when the data being overwritten to the target block contains a 1 where the target block contains a 0. A logical OR operation between bits A and B has the possible outcomes:

| A | B | OR Result |
|---|---|---|
| 0 | 0 | 0 |
| 0 | 1 | 1 |
| 1 | 0 | 1 |
| 1 | 1 | 1 |

A Compare-and-Swap call may be used for locking and thread synchronization when performing overwrites. A client provides the previous version of the block and the new version of the block. More bits are set in the new version. The flash memory, in response to the call, may atomically read the page and compare the read page/block with the previous version provided by the client. If the previous version provided by the client matches the page read from the flash memory, then the page/block is overwritten with the new version provided by the client in the call using, for example, a logical OR. Other compare-and-swap operations to the same page are blocked until the current call completes.

Embodiments of the invention further implement data structures in the flash memory such that the data structure can be updated using overwrites. This prolongs the life of the flash memory by limiting or reducing the number of erasures and can improve the performance of the flash memory. Examples of data structures include, but are not limited to, bloom filters, linked lists, hash tables, locking data structures, trees, graphs, and the like or combinations thereof.

FIG. 1 illustrates an example of a computing system that includes a flash memory and that enables pages to be overwritten from an internal perspective and an external perspective. Overwrites to existing pages (without erasing the data first) can be achieved using internal logic. An external interface, which provides access to an API, allows similar abilities to be invoked by a client. As discussed herein, changing a bit from 0 to 1 is setting a bit and changing a bit from 1 to 0 is unsetting a bit. Unsetting bits can typically only be performed by erasing an erasure unit at a time and an erasure unit may include multiple pages.

FIG. 1 illustrates a computing system 100 that includes processors 102, DRAM 104, flash memory 106, and storage 114. The computing system 100 may be configured to provide computing services such as backup services, document management, contact management, or the like. The computing system 100 can be formed of network connected devices or may be implemented as an integrated unit. The computing system 100 can be connected to a computing network.

The storage 114 may include various hardware storage devices (e.g., magnetic, optical, etc.) such as HDDs. The storage 114 can be arranged in different manners. The DRAM 104 and the flash 106 can be used as caches in the computing system 100. The DRAM, which is the fastest memory, is typically smaller than the flash memory 106. The flash memory 106 is typically smaller than the storage 114. In other embodiments, the flash 106 may be the primary storage and the storage 114 could be omitted. The flash memory 106 can be large (e.g., terabytes or larger). The computing system 100 may be configured for processing large data sets such as backup data, data lake data, or the like.

The flash memory 106 is associated with a flash controller 108 and a flash API 110. The flash controller 108 typically controls operations occurring within the flash 106 and may include its own processor and memory. The flash API 110 allows clients to make specific calls to the flash memory 106, which may be executed by the flash controller 108. The client may be any device or component (e.g., processor, memory controller, process) that interacts with the flash memory 106.

The flash controller 108 is associated with logic 112 that may be configured to interact with the data stored in the flash memory 106. The logic 112, for example, may perform overwrites, logical-ORs, compare-and-swaps, or the like.

Figure 2:
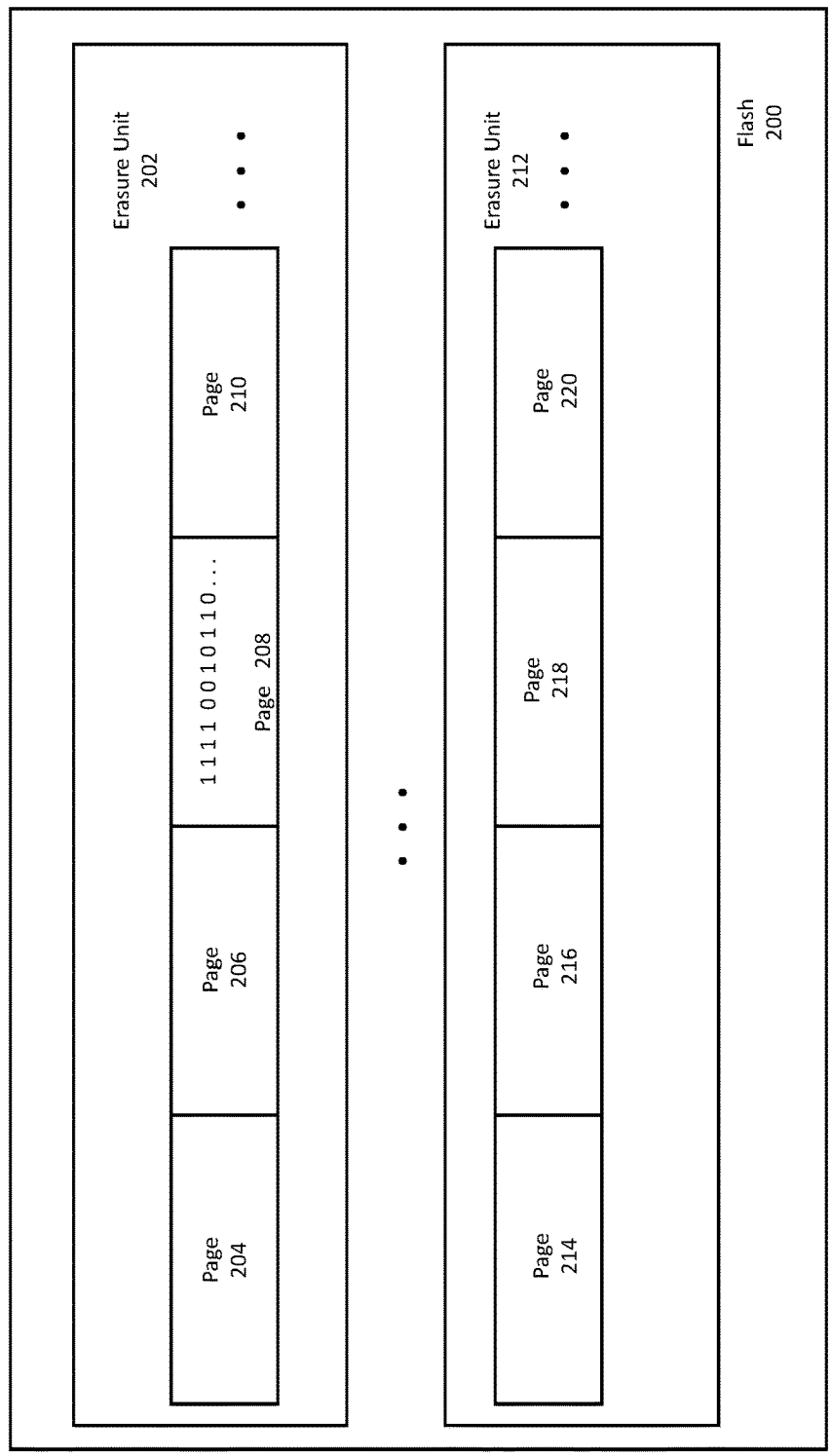
FIG. 2 illustrates an example of a flash memory that is configured to perform overwrites.

FIG. 2 illustrates an example of a flash memory and illustrates how data may be arranged in the flash memory. FIG. 2 illustrates a flash memory 200, which is an example of the flash memory 106 shown in FIG. 1. The flash memory 200 includes erasure units, such as erasure units 202 and 212. Each erasure unit is associated with pages. Pages 204, 206, 208, and 210 are associated with the erasure unit 202 and the pages 214, 216, 218, and 220 are associated with the erasure unit 212. One of skill in the art can appreciate that the flash memory is typically much larger than illustrated.

The pages 204, 206, 208, and 210 are smaller than the erasure unit 202. By way of example only, the pages 204, 206, 208, and 210 may be 4 KB each. The erasure units 202 and 212 may be 1 MB each. Data stored in the flash memory 200 may also be arranged in containers or using other storage arrangements. However, when data is written to the flash memory 200, the data is written in pages and the pages are usually written in sequence.

In order to overwrite a page in a conventional flash, it is necessary to erase all pages in the erasure unit before writing the pages in the newly erased erasure unit or write the new page to a new location. For example, the page 208 includes data. Because the page 208 contains data, a conventional flash cannot simply write new data to the page 208. Rather, it is necessary to erase all pages 204, 206, 208, and 210 in the erasure unit 202 before new data can be written to the page 208. In fact, all pages in the erasure unit 202 would be erased. The new data could alternatively be written to a new location and the existing page or erasure unit marked for erasure.

Embodiments of the invention, in contrast, allow data to be written to the page 208 by performing an overwrite operation. In particular, embodiments of the invention allow data to be written to the page 208 or any other page in the erasure unit 202 as long as the write makes no changes so specific cells (or bits) become unset, but only changes 0 bits to 1s. This is because the flash memory 200 may allow more electrons to be stored in an individual cell (representing one bit) thus semantically changing the value from 0 to 1. Reducing the electrons to change a 1 to a 0, however, involves erasing an entire erasure unit due to the hardware constraints. Thus, data such as 0000 can be overwritten as 0101 because only 0s are being changed to 1s. An overwrite is not permitted when attempting to change 1110 to 0010 because this involves changing 1s to 0s for this type of flash memory. In this case when changing 1s to 0s, it may be necessary to follow conventional flash memory writing procedures, which may involve writing the data to a new page and erasing the pages in the erasure unit.

Figure 3:
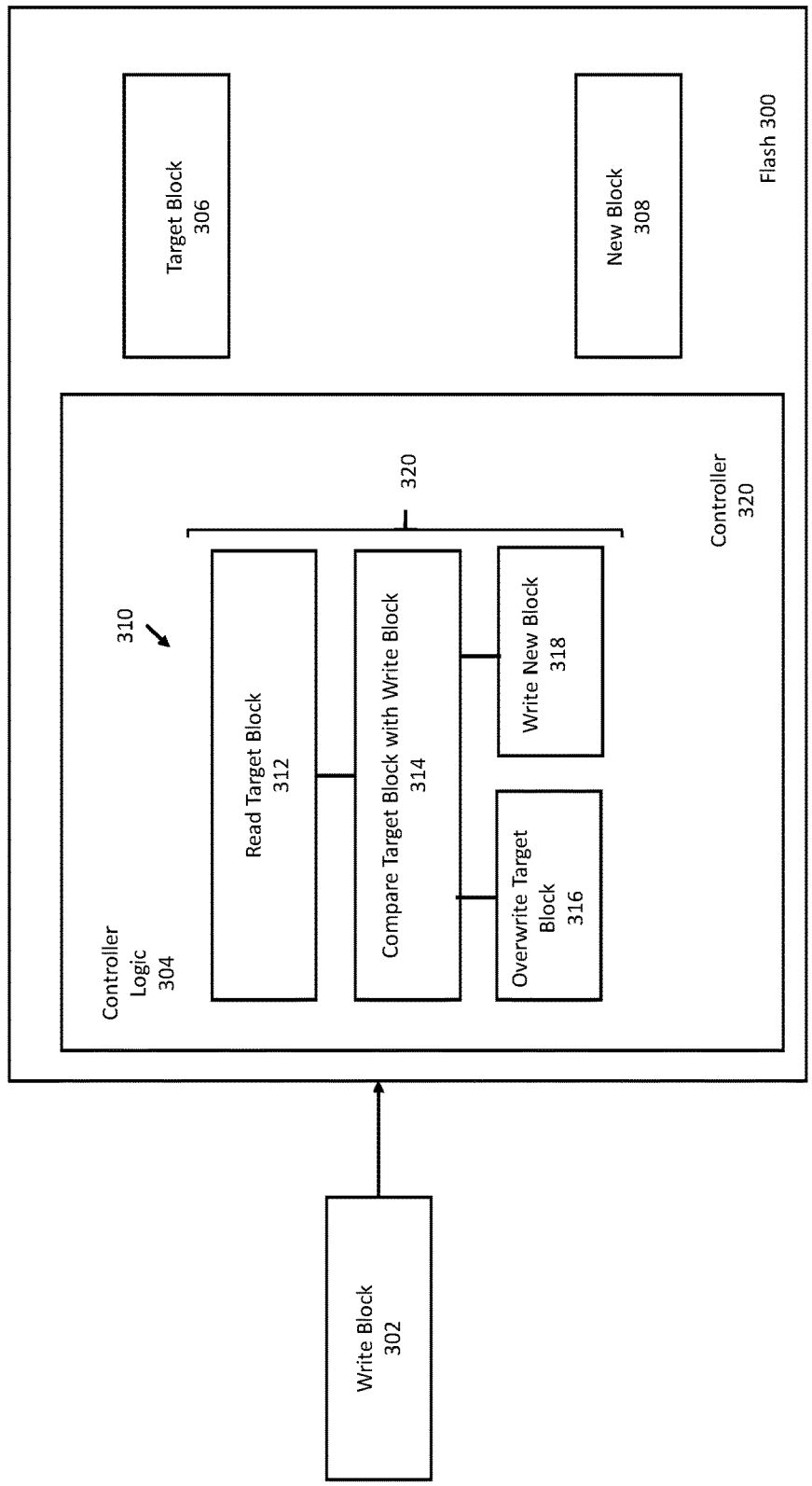
FIG. 3 illustrates an example of internal logic for overwriting portions of a flash memory.

FIG. 3 illustrates an example of a flash memory that includes a controller and illustrates an example of logic associated with performing an overwrite in the flash memory. FIG. 3 illustrates that the flash memory 300 may receive a write block 302 from a client (e.g., a thread, process, or the like). When the write block 302 is received, the controller may perform controller logic 304 to perform the write operation in the flash memory 300.

The write operation may include performing a method 310. The write block 302 may write to more than one page in the flash memory 300. In box 312, the controller 320 may read the target block 306. The target block 306 may be, by way of example, a previous version of the write block 302. The target block 306 may be located at a destination address included in the write request received along with the write block 302.

After reading the target block 306, the controller 320 may compare the target block 306 with the write block 302. The result of the comparison determines, in one example, whether the target block 306 can be overwritten with the write block 302 or whether the write block is written to a new location as the new block 308. The comparison may identify which bits need to be changed from 0s to 1s.

In one example, if the comparison in box 314 determines that writing the write block 302 to the target block 306 would only set bits from 0 to 1, then the target block 306 is overwritten with the write block 302 in box 316. If the comparison determines that it is necessary to reset 1s to 0s, then the write block 302 is written to a new location as the new block 308 in box 318. The target block 306 may be marked for deletion or erasure.

The logic performed in the method 310 is internal to the flash memory 300 in this example. The client associated with the write operation may not be aware of the overwrite method performed in the flash memory 300.

During the method 310 and in particular while reading the target block, comparing the target block with the write block and overwriting the target block, the page or pages associated with the target block are locked at 320 so that another client does not interfere with the method 310. A lock may be used during the overwrite method 310. The controller 320 may set aside some memory to track which regions of the flash memory 300 are locked.

Figure 4:
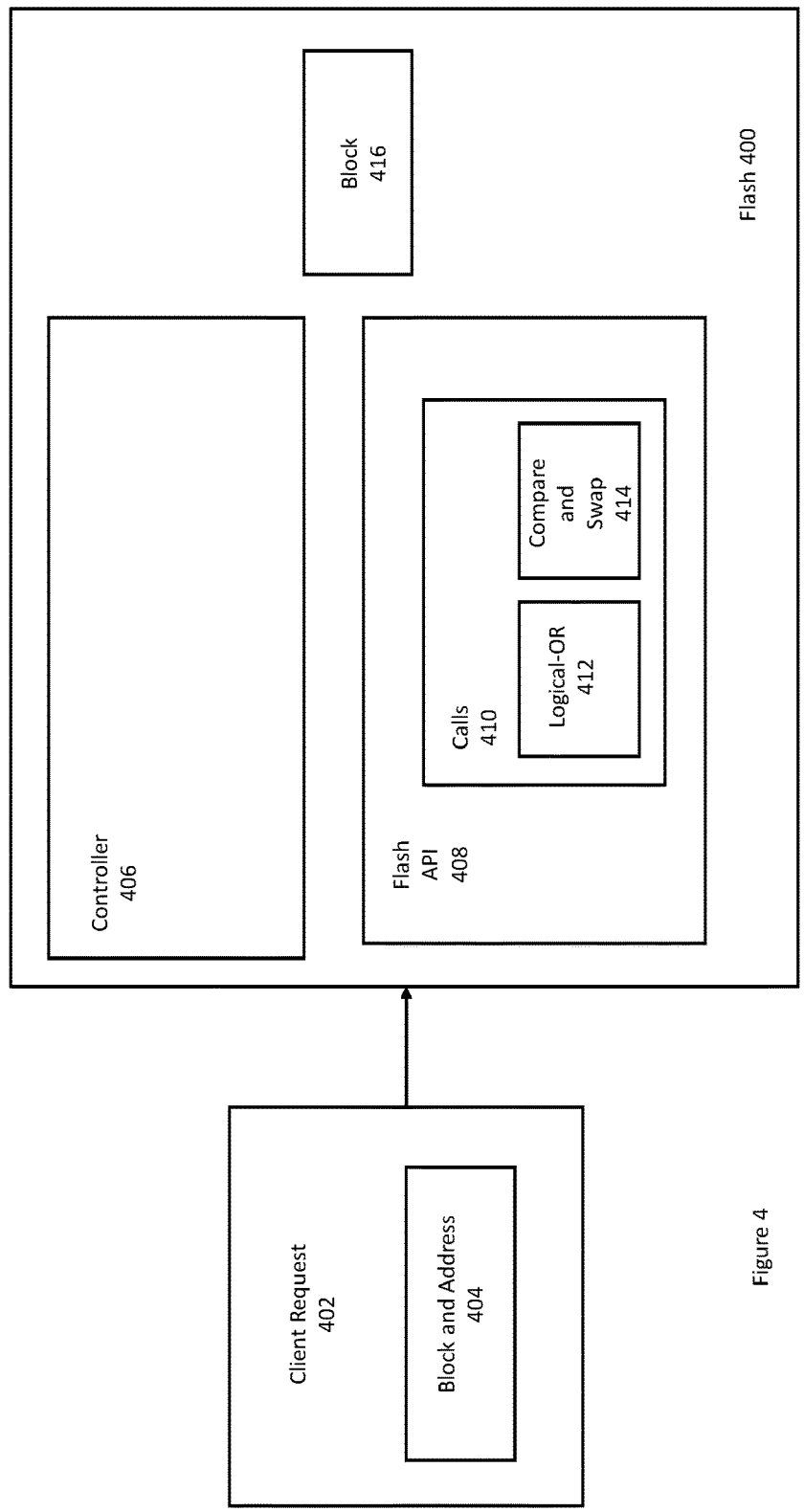
FIG. 4 illustrates an example of an external interface for overwriting portions of a flash memory and for locking portions of the flash memory when performing overwrites.

FIG. 4 illustrates an example of an external interface for overwrites in a flash memory. FIG. 4 illustrates a flash memory 400, which is an example of the flash memory 106 in FIG. 1. The flash memory 400 includes a controller 406 and an API 408. The API 408 includes calls 410 including, by way of example, a logical-OR 412 and a Compare and Swap 414.

In contrast to the internal logic illustrated in FIG. 3, the API allows a client to explicitly call the API 408. The logical-OR call 412 allows a client 402 to provide a block of data and an address 404. A logical OR is performed between the page or pages at the address provided in the client request 402 with the block 416 at the specified address. This call compares or performs a logical OR with each respective bit. A logical OR has the property that it never changes a one to a zero, but zeros may be changed to one if they are ORed with a one. This operation is an overwrite that potentially replaces 0s in the block 416 to 1s. The client may be aware, prior to making the call, that the necessary updates to the block 416 can be achieved with the logical OR operation. Depending on hardware capabilities, a logical OR operation may not be required for each bit. Rather, the logical OR effectively changes 0s in to the block 416 to 1s based on the contents of the block provided in the client request 402. Thus, the logical OR may simply identify the bits to be changed to 1s and make those changes. If the hardware is configures such that an entire page is written at a time, then the page is written such that the relevant 0s are changed to 1s.

The compare and swap call 414 can be used for locking and for thread synchronization when performing overwrites. When making a compare and swap call 414, the client may provide a previous version of a block and a new version of the block. The new version may have new bits set. The controller 406 may then compare the previous version included in the request with the block 416 to insure that another client has not changed the block. If the comparison is equal, the block 416 can be overwritten (e.g., by using logical-OR operation) with the new version included in the client request 402. Other callers attempting to impact or alter block 416 will be blocked until these compare and swap operation completes. Thus, the controller 406 may also lock locations in the flash memory 400 that are being updated or changed in accordance with the controller logic or API calls 410.

The calls and logic discussed herein may be implemented with computer executable instructions and the controller 406 and/or the flash memory 400 are examples of a computing device. The calls and logic discussed herein may also be used when interacting (e.g., read/write/update) with data structures implemented in a flash memory.

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein.

As indicated above, embodiments within the scope of the present invention also include computer storage media, which are physical media for carrying or having computer-executable instructions or data structures stored thereon. Such computer storage media can be any available physical media that can be accessed by a general purpose or special purpose computer.

By way of example, and not limitation, such computer storage media can comprise hardware such as solid state disk (SSD), RAM, ROM, EEPROM, CD-ROM, flash memory, DRAM, phase-change memory ("PCM"), or other optical disk storage, magnetic disk storage or other magnetic storage devices, or any other hardware storage devices which can be used to store program code in the form of computer-executable instructions or data structures, which can be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' can refer to software objects or routines that execute on the computing system. The different components, modules, engines, and services described herein may be implemented as objects or processes that execute on the computing system, for example, as separate threads. While the system and methods described herein can be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein. A controller may include a processor and memory and/or other computing chips.

In terms of computing environments, embodiments of the invention can be performed in client-server environments, whether network or local environments, or in any other suitable environment. Suitable operating environments for at least some embodiments of the invention include cloud computing environments where one or more of a client, server, or target virtual machine may reside and operate in a cloud environment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. In a system that includes a flash memory, a method for overwriting a portion of the flash memory, the method comprising:
   receiving a write request at a flash memory from a client that includes a write block, wherein the flash memory includes a controller and an external interface, wherein the controller performs write requests that are internal to the system and wherein the external interface allows the client to make a call to the flash memory, wherein the client specifies how to perform the write request in the flash memory via the call to the flash memory received through the external interface,
   comparing the write block with a target block in the flash memory; and
   overwriting the target block when the comparison indicates that only sets are needed to write the write block to the target block.

2. The method of claim 1, further comprising writing the write block to a new location in the flash memory when unsets are required to write the write block to the target block.

3. The method of claim 1, further comprising receiving a location in the write request.

4. The method of claim 1, further comprising reading the target block internally after receiving the write request.

5. The method of claim 4, further comprising locking the target block with a lock when reading the target block, comparing the write block with the target block, and overwriting the target block.

6. The method of claim 5, further comprising reading the target block before overwriting the target block.

7. The method of claim 6, further comprising unlocking the target block after overwriting the target block.

8. In a system that includes a flash memory, a method for writing to a flash memory, the method comprising:
   receiving a call from a client at an external interface of the flash memory, wherein the call includes a data block and an address and wherein the call from the client specifies an operation for performing a write to the flash memory;
   specifying how to perform the operation via the call from the client to the flash memory received through the external interface;
   overwriting a target block at the address with the data block when only sets are required to write the data block to a location of the target block using the specified operation; and
   writing the data block to a new location when an unset is required to write the data block to the location of the target block.

9. The method of claim 8, wherein the call comprises a logical OR and the external interface comprises an application programming interface.

10. The method of claim 8, wherein the call comprises a compare and swap and the external interface comprises an application programming interface.

11. The method of claim 9, wherein the logical OR modifies the target block to be the logical OR of its contents with the contents of the data block.

12. The method of claim 10, wherein the call further includes a previous version of the target block and the data block, which is a new version of the target block.

13. The method of claim 12, wherein the new version includes more set bits than the target block.

14. The method of claim 12, further comprising comparing the previous version with the target block and overwriting the target block with the data block when the previous version matches the target block.

15. The method of claim 14, wherein the data block is not written to the target block when the previous version does not match the target block.

16. The method of claim 14, wherein the call locks the target block while the call is executed.

17. In a system that includes a flash memory comprising:
   a memory configured to store data segments, wherein the memory is written in pages and erased based on erasure units, wherein each erasure unit included multiple pages;
   an external interface that is configured to receive calls from a client that cause the target block to be overwritten, wherein the client specifies the a call when accessing the external interface and wherein the client specifies how to overwrite the target block in the flash memory via the calls from the client received through the external interface; and
   a controller that includes a processor, the controller configured to execute logic in response to the calls from the client when writing a data block to a location in the memory in which is stored a target block, wherein the controller overwrites the target block with the data block when only sets are required and wherein the controller writes the data block to a new location when an unset is required and wherein the controller performs writes to the memory that are from the system and that are received from the external interface.

18. The flash memory of claim 1, wherein a set includes setting a 0 to a 1 and wherein an unset includes setting a 1 to a 0, wherein unsets are performed on entire erasure units.

19. The flash memory of claim 17, wherein the external interface allows the client to issue a logical OR call that modifies contents of the target block at the location to be the logical OR of the contents of the data block, wherein the logical OR sets 0s in the target block to 1s based on the contents of the data block.

20. The flash memory of claim 17, wherein the external interface allows the client to issue a compare and swap call that includes a previous version of the target block and the data block, which is a new version of the target block, wherein the target block is combined with the data block by logical-OR when the previous version of the target block matches the target block at the location.

* * * * *